United States Patent [19]
Yuzuriha

[11] Patent Number: 6,069,391
[45] Date of Patent: May 30, 2000

[54] SEMICONDUCTOR DEVICE WITH BOOSTING CIRCUIT AND DETECTING CIRCUIT

[75] Inventor: Kojiro Yuzuriha, Tokyo, Japan

[73] Assignee: Mitsubishi Denki Kabushiki Kaisha, Tokyo, Japan

[21] Appl. No.: 08/933,835

[22] Filed: Sep. 19, 1997

[30] Foreign Application Priority Data

Mar. 12, 1997 [JP] Japan ................................. 9-057817

[51] Int. Cl.[7] .................................................. H01L 29/00
[52] U.S. Cl. ........................ 257/374; 257/379; 257/380; 257/536
[58] Field of Search ................................. 257/536, 390, 257/379, 374, 380

[56] References Cited

U.S. PATENT DOCUMENTS 5,847,597   12/1998   Ooishi et al. ............................ 327/543

FOREIGN PATENT DOCUMENTS 59-121863   7/1984   Japan .
4-146665    5/1992   Japan .
5-325580    12/1993  Japan .

*Primary Examiner*—William Mintel
*Attorney, Agent, or Firm*—McDermott, Will & Emery

[57] ABSTRACT

A semiconductor device, including a circuit configuration formed on a semiconductor substrate, comprises: a boosting circuit for boosting an external power supply voltage to a plus voltage and a minus voltage; and a detecting circuit having a resistor formed of an impurity diffused layer so that the plus voltage and the minus voltage boosted by the boosting circuit are respectively connected to the resistor, to detect a potential at a prescribed point of said resistor so as to verify whether or not the boosting circuit has generated a desired potential.

14 Claims, 10 Drawing Sheets

SEMICONDUCTOR DEVICE WITH BOOSTING CIRCUIT AND DETECTING CIRCUIT

BACKGROUND OF THE INVENTION

The present invention relates to a semiconductor device, and more particularly to an EEPROM (Electrically Erasable and Programmable ROM) semiconductor storage device incorporating a boosting circuit.

A high voltage is required for write/erase of data for the cells of a semiconductor storage device such as an EEPROM. But, incorporating a boosting circuit in the device makes it unnecessary to provide a high voltage source externally. Thus, the voltage supplied from a certain external voltage source can be boosted to a desired minus or plus voltage. In this case, whether or not a desired potential has been generated can be decided by monitoring it using a detection circuit. For example, a conventional DINOR (Divided bit-line NOR) type flash memory, disclosed in 1992 IEDM TECHNICAL DIGEST pp. 599–602 "A NOVEL CELL STRUCTURE SUITABLE FOR A 3 VOLT OPERATION, SECTOR ERASE FLASH MEMORY" 1995 ISSCC DIGEST OF TECHNICAL PAPERS "A 3.3 v-Only 16 Mb DINOR RECEIVED flash Memory", has a circuit configuration for boosting and detecting.

As shown in FIG. 15, the potentials generated from boosting circuits 1a and 1b are connected to a resistor 3 of the detection circuit 2. The potential at a prescribed position of the flash memory is detected by a detecting section 4.

In the DINOR type flash memory, the potentials of 10 V and –8 V are generated by boosting circuits 1a and 1b from a single external power supply voltage (not shown). For example, assuming that the connecting points between the boosting circuits 1a, 1b and the resistor 3 are A and B, respectively, when the potential at the detecting point 4 provided at the point dividing the segment between A and B at a ratio of 8.5:9.5 is 1.5 V, it is recognized that a desired potential has been generated.

The resistor 3 used in such a detecting circuit is made of the same material used when the floating gate and control gate constituting a memory cell is fabricated.

In order to prevent the boosted potential in the boosting circuits 1a, 1b, from being reduced, the detecting circuit 2 is required to suppress power consumption and prevent surplus current leakage from the boosting circuits 1a, 1b. This requires that the resistance of the resistor 3 be relatively large so that the current flowing to the detecting circuit 2 is small.

However, since the resistor 3 used in the detection circuit 2 of the conventional EEPROM is made of the same material as that of a floating gate or control gate, it is made of a polysilicon film or a polycide film, i.e., a laminated film composed of a polysilicon film and a refractory metal suicide film. For this reason, the floating gate made of a polysilicon film with a small sheet resistance, e.g., with a thickness of 100 nm and boron impurity concentration of 7E20/cm$^3$ has a small sheet resistance of about 70 $\Omega/^H_T$. The control gate made of a polycide film of a WSi film of 100 nm and a polysilicon film of 100 nm used as a word line of the memory cell has a very small sheet resistance of about 12 $\Omega/^H_T$.

Thus, the resistor 3, which is made of a material having a small sheet resistance, leads to an increase in the area for assuring adequate resistance and hence is not suitable for the requirements of miniaturization and high-integration of recent years.

In the resistor 3 made of the polysilicon of the floating gate, when the oxide film on the polysilicon film is etched for connection to the boosting circuits 1a, 1b and the detecting point to form a connecting hole, because of over-etching, the connecting hole might penetrate through the polysilicon, as shown in FIG. 16. In FIG. 16, 3a denotes the polysilicon of the floating gate constituting the resistor 3; 5 denotes a semiconductor substrate (hereinafter referred to as "substrate"); 6 denotes a field oxide film formed on the substrate 5; 7 denotes an oxide film formed on the polysilicon film 3a; 8 denotes a connecting hole formed in the oxide film; and 9 denotes a wiring layer connected to the polysilicon film 3a.

The polysilicon film 3a of the floating gate is a thin film having a thickness of e.g. 100 nm or so, and is thin particularly on the field oxide film 6 because of the variation in the film thickness. Therefore, as shown in FIG. 16, when the connecting hole 8 is formed, because of over-etching, punch-through may easily occur in the polysilicon film 3a. The contact resistance with the wiring layer 9 to be formed in the subsequent step may increase. Further, since the underlying field oxide film 6 is easily etched, the hole may partially reach the underlying substrate 5 (not shown). In this case, the polysilicon film 3a and the substrate 5 may be short-circuited.

SUMMARY OF THE INVENTION

In order to solve the above problem, in a semiconductor storage device incorporating a boosting circuit and a detecting circuit for detecting its potential, the present invention provides a structure of a semiconductor device which can reduce the area of a resistor used in the detecting circuit to realize its miniaturization and high-integration and detect the potential in the boosting circuit with high reliability, and a method of fabricating it.

The semiconductor device of aspect 1 of the present invention incorporates, in a circuit configuration on a semiconductor substrate, a boosting circuit for boosting an external power supply voltage to a plus or minus voltage; and a detecting circuit having a resistor formed of an impurity diffused layer so that the plus voltage and the minus voltage boosted by the boosting circuit are respectively connected to the resistor, to detect a potential at a prescribed point, thereby verifying whether or not the boosting circuit has generated a desired potential.

A semiconductor device of aspect 2 according to aspect 1 defines a structure, wherein in the semiconductor substrate having a first conductivity type, a well region having the first conductivity type and another well region having a second conductivity type are formed, and surrounding the lower surface and side of the first-conductivity-type well region, and the impurity diffused layer constituting the resistor is formed to have the second conductivity type within the well region having the first conductivity type.

A semiconductor device of aspect 3 defines a structure, wherein the well region having the second conductivity type is formed in the semiconductor substrate having the first conductivity type, and the impurity diffused layer constituting the resistor is formed to have the first conductivity type within the well region having the second conductivity type.

A semiconductor device of aspect 4 defines a structure, wherein elements of an EEPROM (Electrically Erasable and Programmable ROM) are constituted an the semiconductor substrate, and the boosting circuit and the detecting circuit are included in the EEPROM.

A semiconductor device of aspect 5 defines a structure, wherein elements of a DINOR (Divided bit-line NOR) type flash memory are constituted on the semiconductor substrate, and the boosting circuit and the detecting circuit are included in the DINOR type flash memory.

A semiconductor device of aspect 6 defines a structure, wherein the plus boosted potential VH provided by the boosting circuit is connected to one end of the impurity diffused layer, and the minus boosted potential VL is connected to the other end of the impurity diffused layer; when the detecting circuit operates, a fixed potential Va is applied to the well region having the first conductivity type, a fixed potential Vb is applied to the well region having the second conductivity type and a fixed potential Vc is applied to the semiconductor substrate, and the fixed potentials Va, Vb and Vc are set so that at the respective junctions between the impurity diffused layer and the well region having the first conductivity type, between the well regions having the first and second conductivity types and between the well region having the second conductivity type and the semiconductor substrate, and the potential difference between the regions forming the junction are equal to or lower than the forward and reverse junction withstand voltages.

A semiconductor device of aspect 7 defines a structure, wherein the plus boosted potential VH provided by the boosting circuit is connected to one end of the impurity diffused layer, and the minus boosted potential VL is connected to the other end of the impurity diffused layer; and when the detecting circuit operates, a fixed potential Vd is applied to the well region having the second conductivity type, a fixed potential Ve is applied to the semiconductor substrate, and the fixed potentials Vd and Ve are set so that at the respective junctions between the impurity diffused layer and the well region having the second conductivity type, and between the well region having the second conductivity type and the semiconductor substrate, and the potential difference between the regions forming the junction are equal to or lower than the forward and reverse junction withstand voltages.

A semiconductor device of aspect 8 defines a structure, wherein at the junction between the impurity diffused layer and the well region, when the boosted potentials VH and VL are applied to the impurity diffused layer, the reverse junction withstand voltage at respective points of the impurity diffused layer for the well region is set so as to be larger than the potential difference between the potential applied to the respective points of the impurity diffused layer, and the fixed potential Va (or Vd) of the well region.

A semiconductor device of aspect 9 defines a structure comprising: a field oxide film for element isolation, and an isolation layer formed in proximity to and below it formed by ion implantation, wherein the isolation layer below the field oxide film separating the impurity diffused layer from other regions is formed to have a low impurity concentration not exceeding about $1E17/cm^3$.

A semiconductor device of aspect 10 defines a structure comprising: a field oxide film for element isolation and an isolation layer formed in proximity to and below it formed by ion implantation, wherein the isolation layer below the field oxide film separating the impurity diffused layer from other regions is formed so that the peak concentration of implanted impurity ions (boron) is located at a deep position of about 15–20% of the thickness of the field oxide film 13 from its bottom.

A semiconductor device of aspect 11 defines a structure comprising: a field oxide film for element isolation, and an isolation layer formed in proximity to and below it formed by ion implantation, wherein the impurity diffused layer is formed of an n-type (or p-type), and the isolation layer is not formed at the area below and in the vicinity of the field oxide film abutting on the end of the impurity diffused layer on the side to which the boosted potential VH (or VL) is connected.

A semiconductor device of aspect 12 defines a structure comprising: a field oxide film for element isolation, and an isolation layer formed in proximity to and below it formed by ion implantation, wherein the isolation layer is not formed over the entire area where the impurity diffused layer is formed.

A semiconductor device of aspect 13 defines a structure, wherein the impurity diffused layer is formed of the n-type (or p-type), in a prescribed region extending from the end of the impurity diffused layer to which the boosted potential of VH (or VL) is connected, and a second impurity diffused layer having the same conductivity type as and a lower impurity concentration than those of the impurity diffused layer is formed in proximity to and below the impurity diffused layer.

A semiconductor device of aspect 14 defines a structure comprising: a field oxide film for element isolation, and an isolation layer formed in proximity to and below it formed by ion implantation, wherein the impurity diffused layer is formed of the n-type (or p-type), and the position in the impurity diffused layer to which the boosted potential VH (or VL) is connected is spaced apart from the field oxide film separating the impurity diffused layer from other regions by a prescribed distance from the field oxide film.

A semiconductor device of aspect 15 defines a structure, wherein the position in the impurity diffused layer to which the boosted potential VH (or VL) is connected is spaced apart from the field oxide film by about 1 82 m.

A semiconductor device of aspect 16 defines a structure comprising: a field oxide film for element isolation, and an isolation layer formed in proximity to and below it formed by ion implantation, wherein the impurity diffused layer is formed of the n-type (or p-type), and the end of the impurity diffused layer on the side of which the boosted potential VH (or VL) is connected is spaced apart from the field oxide film separating the impurity diffused layer from other regions by a prescribed distance from the field oxide film.

A semiconductor device of aspect 17 defines a structure, wherein the one end of the impurity diffused layer is spaced apart from the field oxide film separating the impurity diffused layer from other regions by about 1 $\mu$m from the field oxide film.

A semiconductor device of aspect 18 defines a structure, wherein the impurity diffused layer is formed of the n-type and the fixed potential Va (or Vd) of the well region abutting on the impurity diffused layer is set at the potential equal to the boosted potential VL, or otherwise the impurity diffused layer is formed of the p-type and the fixed potential Va (or Vd) of the well region abutting on the impurity diffused layer is set at the potential equal to the boosted potential VH.

A method of fabricating a semiconductor device of aspect 19 is a method of fabricating a semiconductor device incorporating, in a circuit configuration on a semiconductor substrate, a boosting circuit for boosting an external power supply voltage to a plus voltage and a minus voltage; and a detecting circuit having a resistor formed of an impurity diffused layer so that the plus voltage and the minus voltage boosted by the boosting circuit are respectively connected to the resistor, to detect a potential at a prescribed point, thereby verifying whether or not the boosting circuit has generated a desired potential, comprising the step of: forming the impurity resistor diffused layer constituting the resistor simultaneously with a highly doped diffused layer constituting a source/drain region of an MOS transistor formed on the semiconductor substrate or with a lightly doped diffused layer constituting an LDD structure.

A method of fabricating a semiconductor device of aspect 20 is a method of fabricating a semiconductor device incorporating, in a circuit configuration on a semiconductor substrate having a first conductivity type, a boosting circuit for boosting an external power supply voltage to a plus voltage and a minus voltage; and a detecting circuit having a resistor formed of an impurity diffused layer having a second conductivity type so that the plus voltage and the minus voltage boosted by the boosting circuit are respectively connected to the resistor, to detect a potential at a prescribed point, thereby verifying whether or not the boosting circuit has generated a desired potential, wherein a prescribed area of the semiconductor substrate is separated from other regions by forming a well region of the second conductivity type so as to surround the bottom and side of the well region, and a resistor of the impurity diffused layer is formed in the separated prescribed region of the semiconductor substrate.

DETAILED DESCRIPTION OF THE PREFERRED EMBODIMENTS (Embodiment 1)

Figure 1A:
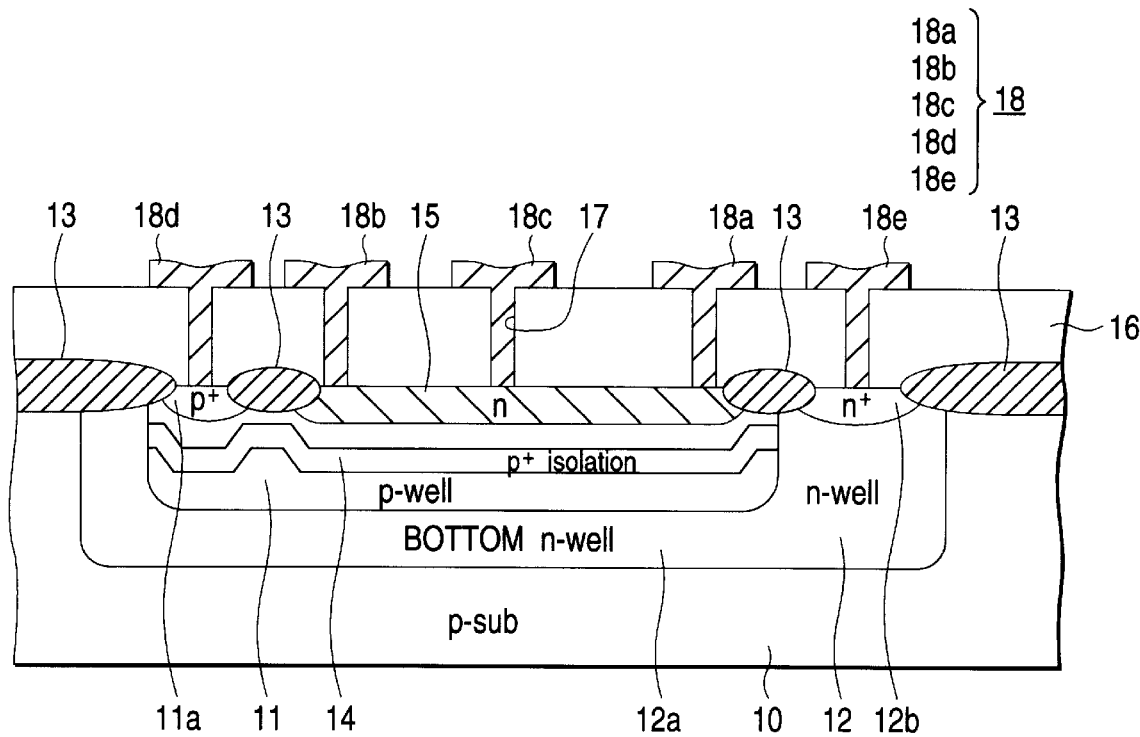
FIGS. 1A and 1B are sectional views showing the structure of a semiconductor device according to the first embodiment of the present invention.
Figure 1B:
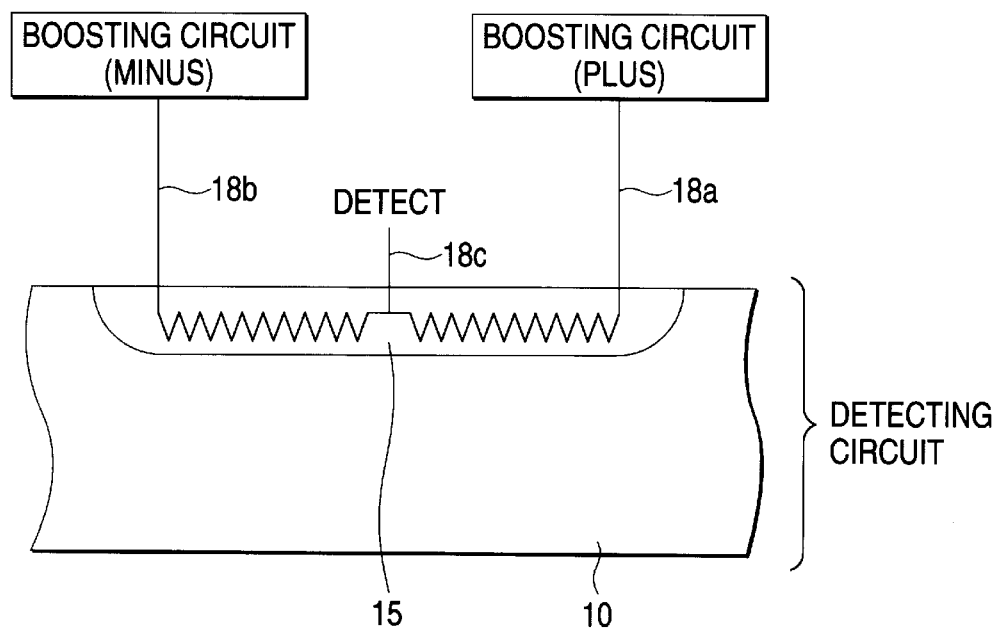

Referring now to the drawings, an explanation will be given of the first embodiment. FIGS. 1A and 1B are sectional views of the structure of a detecting circuit (which is a circuit for detecting the potential in the boosting circuit) incorporated in an EEPROM according to the first embodiment of the present invention. FIG. 1A is a sectional view showing the device structure, and FIG. 1B is a sectional view simply showing the circuit structure.

In FIGS. 1A and 1B, reference numeral 10 denotes a semiconductor substrate (hereinafter referred to as "P-type substrate") made of e.g. p-type silicon single crystal; 1 a an electrode contacting layer of the p-well region; 11 an internal p-well region formed within the p-type substrate 10; 12 an n-well region formed within the p-type substrate 10 to surround the bottom and side of the p-well region 11; 12a a bottom n-well region formed particularly below the p-well region 11 within n-well region 12; 12b an electrode contacting layer of the n-well region 12; and 13 an isolation layer for improving the element isolation formed within the p-well region 11.

Reference numeral 15 denotes a n-type diffused layer as an impurity diffused layer constituting a resistor of the detecting circuit; 16 an interlayer oxide film; and 17 a connecting hole formed in the interlayer oxide layer 16.

Reference numeral 18 denotes a wiring layer with which the connecting hole 17 is filled. Specifically, 18a is a wiring layer for connecting the potential generated in the boosting circuit which can generate a plus (+) potential of e.g. 10 V to the one end of the n-type diffused layer 15 which is a resistor; 18b is a wiring layer for connecting the potential generated in the boosting circuit which can generate a minus (−) potential of e.g. 8 V to the other terminal of the n type diffused layer 15 which is a resistor; 18c a wiring layer for detecting the potential at a prescribed point (potential detecting point) of the n-type diffused layer 15; 18d a wiring layer connected to the electrode contacting layer of the p-well region 11; and 18e is a wiring layer connected to the electrode contacting layer of the n-well region 12.

In this embodiment, as seen from FIGS. 1A and 1B, the resistor of the detecting circuit is formed of an n-type diffused layer 15. The potential generated from the boosting circuit is connected to the n-type diffused layer 15 to detect the potential at a prescribed point, thereby deciding whether or not a desired potential has been generated. This n-type diffused layer 15 is formed by ion implantation, for example, simultaneously with another n-type diffused layer (not shown) formed on the p-type substrate 10. For example, the n-type diffused layer constituting a source/drain region of an n-type MOS transistor has a high sheet resistance of about 10 $\Omega/F_F$ at an impurity concentration $1E20/cm^3$ of phosphorus (P) and a very high sheet resistance of about 1 $K\Omega/F_F$ at an impurity concentration $1E18/cm^3$ (low impurity concentration in an LDD structure).

In this way, in this embodiment, the resistor of the detecting circuit, which is formed of the n-type diffused layer 15, can have much higher resistance with a smaller area than that of the resistor formed of the same material as that of the floating gate or control gate in the prior art.

Realization of a resistor (n-type diffused layer 15) having high resistance can reduce the current flowing through the detecting circuit, thereby suppressing power consumption and preventing surplus current leakage from the boosting circuit so that reduction in the boosted potential in its boosting circuit can be prevented.

Thus, the area of the detecting circuit can be reduced so that a reliable EEPROM which can promote miniaturization and high integration and prevent the boosted potential in the boosting circuit from being reduced can be obtained.

When the interlayer oxide film 16 is etched to form the connecting hole 17 reaching the resistor (n-type diffused layer 15), since the n-type diffused layer 15 has a very low etching rate and has a depth of 200–300 nm, the connecting hole 17 will not penetrate the n type diffused layer 15 owing to over-etching. At its contact points with the overlying wiring layer 18a, 18b and 18c, stabilized contact resistance can be obtained, thus permitting the potential in the boosting circuit to be detected reliably.

In this embodiment, in order to separate the p-well region 11 within which the n-type diffused layer is formed from the p type substrate 10, the p-well region 11 is formed in a triple well structure surrounded by the n-well region 12. This permits forming the resistor 15 formed of the n type diffused layer within p-type substrate 10.

The case where the resistor is formed of a lightly doped n-type diffused layer will now be explained. N-channel LDD (lightly doped drain) type transistors are utilized in many LSI devices, as is well known. The resistor formed of the n-type diffused layer 15 which can be formed simultaneously with the lightly doped diffused layer of the source/drain region can have very high resistance with a small area.

This embodiment is particularly efficient in the DINOR type flash memory in an EEPROM.

Figure 2:
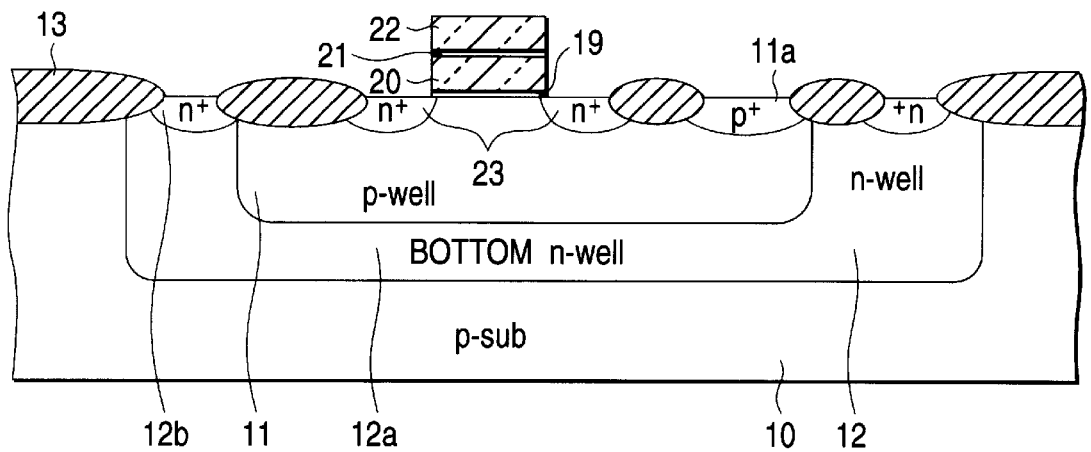
FIG. 2 is a sectional view showing the structure of a memory transistor of a DINOR type memory.

FIG. 2 is a sectional view showing the structure of the memory transistor in the DINOR type flash memory. In FIG. 2, reference numerals 10, 11, 11a, 12, 12a, 12b and 13 refer to like parts in FIGS. 1A and 1B. Reference numeral 19 denotes a first gate oxide film called a "tunneling oxide film", 20 a floating gate formed on the p-type substrate 10 through the first gate oxide film 19, 21 a second gate oxide film formed on the floating gate 20, 22 a control gate formed on the floating gate 20 through the second gate oxide film 21, and 23 a source/drain region. For simplicity of illustration, the interlayer oxide film and the wiring layer are not shown.

As shown in FIG. 2, the DINOR type flash memory is formed in a triple well structure. For this reason, the detecting circuit having a triple well structure as shown in FIGS. 1A and 1B can be easily fabricated in the DINOR type flash memory because of good compatibility therebetween during processing.

The DINOR type flash memory developed in recent years has realized compatibility between low voltage or low power and high speed rewriting by changing the mechanism of injecting electrons during write from the channel hot electron (CHE) system into the Fowler-Nordheim (F-N) system and also has a structure suitable to high integration.

The detecting circuit according to this embodiment, in which the resistor is structured in an n-type diffused layer 15 as described above, can be reduced in its area and hence has a structure suitable for miniaturization and high integration. The detecting circuit can have a structure suitable to realize low voltage and low power. Specifically, as described above, the detecting circuit can realize a resistor (n-type diffused layer 15) having high resistance to reduce the current flowing through the detecting circuit, thereby suppressing power consumption and preventing surplus current leakage from the boosting circuit so that reduction in the boosting potential in the boosting circuit can be prevented. In short, the detecting circuit is structured so as to be very suitable to the DINOR type flash memory. Therefore, the detecting circuit can surely attain the advantage described above in its application to the DINOR type flash memory. Thus, the DINOR type flash memory with high performance and high reliability can be obtained.

In this embodiment, in order to form the resistor formed of the n-type diffused layer 15 in the p-well region 11, a p-n junction is formed. Further, p-n junctions are also formed between the p-well region 11 and n-well region 12 and between the n-well region 12 and the p-type substrate 10, respectively.

Therefore, in putting this embodiment into practice, it is necessary to prevent current flow at the junction when a voltage is applied to the detecting circuit, i.e., a forward current and an avalanche current flowing when a voltage higher than a reverse biased breakdown voltage is applied.

The reverse-biased leakage current is negligibly small at a voltage lower than the reverse-biased breakdown voltage.

Figure 3:
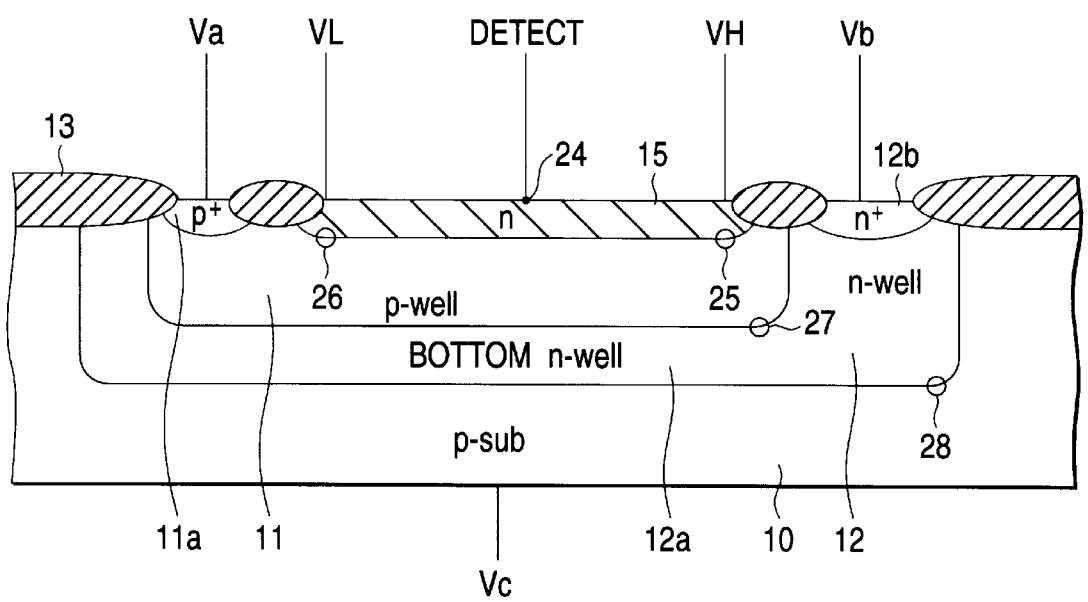
FIG. 3 is a sectional view showing the voltage and reverse junction withstand voltage applied to the detecting circuit according to the first embodiment of the present invention.

Referring to FIG. 3, an explanation will be given of the method of preventing the current flow at the junction in both forward and reverse directions. FIG. 3 is a sectional view showing the voltage applied to the detecting circuit shown in FIGS. 1A and 1B and a reverse junction withstand voltage (or reverse bias breakdown voltage). For simplicity of illustration not shown are the isolation layer 14, interlayer oxide film 16, connecting hole 17 and wiring layer 18.

As seen from FIG. 3, symbol VH denotes a plus potential to be generated in the boosting circuit, which is connected to one end of the n-type diffused layer 15. Symbol VL denotes a minus potential to be generated in the boosting circuit, which is connected to the other end of the n-type diffused layer 15. Symbol Va denotes a potential applied to the electrode extracting layer 11a of the p-well region 11, which is a fixed potential of the p-well region 11. Symbol Vb denotes a potential applied to the electrode extracting layer 12b of the n-well region 12. Symbol Vc denotes a fixed potential of the p-type substrate. Reference numeral 24 denotes a potential detecting point of the n-type diffused layer 15.

Reference numeral 25 denotes a junction between the n-type diffused layer 15 to which the potential of VH is applied and the p-well region 11 (referred to as "junction (1)"). Reference numeral 26 denotes a junction between the n-type diffused layer 15 to which the potential of VL is applied and the p-well region 11 (referred to as "junction (2)"). Reference numeral 27 denotes a junction between the p-well region 11 and the n-well region 12 (referred to as "junction (3)").

Reference numeral 28 denotes a junction between the n-well region 12 and the p-type substrate 10 (referred to as "junction (4)").

Assuming that BVjX represents the reverse junction withstand voltage at the junction X, the voltages applied to the detecting circuit in order to prevent the current in the forward and backward directions are defined as follows.

At junction (1) 25, $-0.6\ V < VH - Va < BVj$ (1)

At junction (2) 26, $-0.6\ V < VL - Va < BVj$ (2)

At junction (3) 27, $-0.6\ V < Vb - Va < BVj$ (3)

At junction (4) 28, $-0.6\ V < Vb - Vc < BVj$ (4)

Now, 0.6 V is a constant voltage necessary to pass the current in the forward direction of the p-n junction.

When the semiconductor device as shown in FIGS. 1A and 1B is fabricated under a general condition, the reverse function withstand voltages between the wells and between the well and the substrate are about 25 V or so. Therefore, under the condition that BVj (3) and BVj (4) are 25 V; VH=10 V and VL=−8 V in a DINOR type flash memory application; and Vc=0 V (the p-type substrate is generally grounded), from the above equations, the following condition is obtained.

−0.6V<Vb<25 V

Va<−7.4 V

Vb−25 V<Va<Vb+0.6 V

Figure 4:
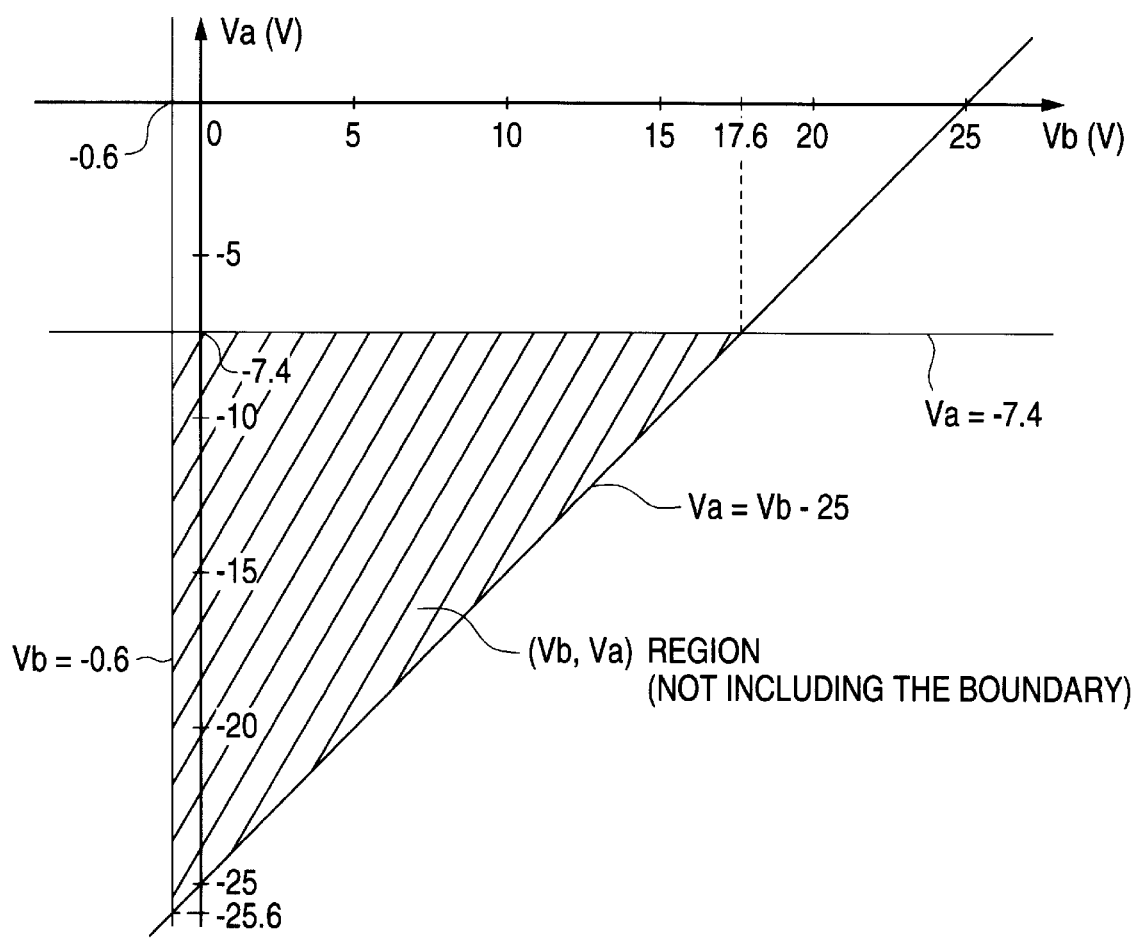
FIG. 4 is a graph for explaining the voltage applied to the detecting circuit according to the first embodiment.

Thus, the range of Va and Vb are represented by the shaded portion in FIG. 4.

Figure 5:
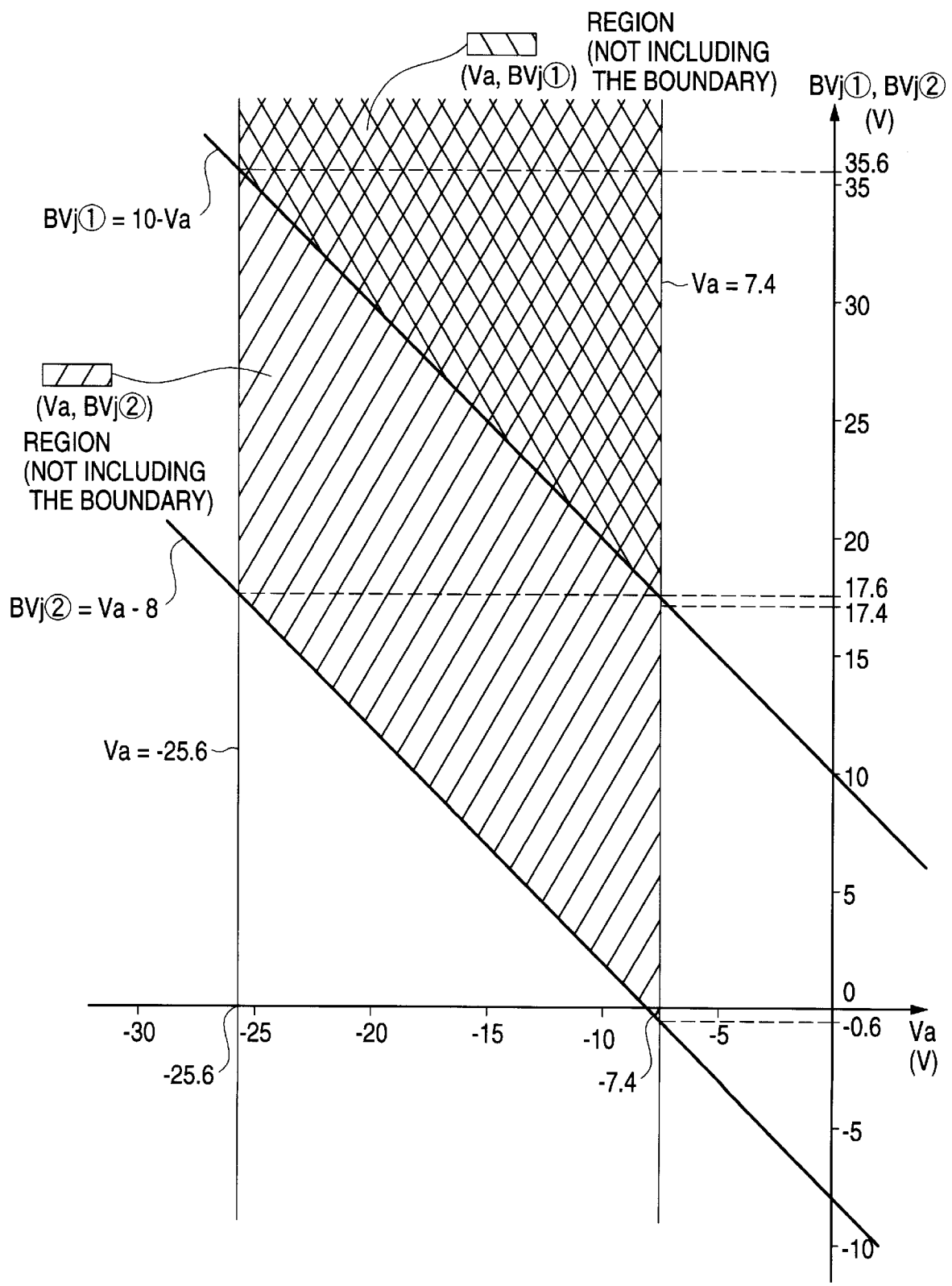
FIG. 5 is a graph for explaining the reverse junction withstand voltage in the detecting circuit according to the first embodiment of the present invention.

BVj (1) and BVj (2) which are variable according to the condition of forming the n-type diffused layer 15 and others result in BVj (1)>10V−Va BVj (2)>−8 V−Va Further, since Va falls in a range −25.6 V<Va<−7.4 V, the shaded portion in FIG. 5, it can be seen that at the junction (1) 25 between the n type diffused layer to which the potential of VH is applied and the p-well region, a reverse junction withstand voltage BVj (1) exceeding 17.4 V is required.

The reverse junction withstand voltage at the pn junction can be increased by decreasing the impurity concentrations of the p-type region and n-type region forming a pn junction. This is because the width of the depletion layer when the junction is reverse-biased is increased due to the decrease in the impurity concentration.

The n-type diffused layer 15 formed at a low impurity concentration of e.g. $1E18/cm^3$ realizes very high resistance with a small area and a high reverse junction withstand voltage at the junction with the p-well region 11. The above effect can be easily obtained by forming the n type diffused layer simultaneously with the lightly doped diffused layer in the LDD structure of the source/drain region as described above since the impurity concentrations of both layers are substantially equal.

Meanwhile, when VH is applied to one end of the n type diffused layer 15 and VL is applied to the other end of thereof, the potential has a gradient from the one end to the other end in accordance with the flowing current and resistance. It should be noted that a reverse junction withstand voltage BVjX is required according to a junction X existing between the respective points in the n type diffused and the p-well region 11.

Namely, assuming that the potential at each of the respective points in the n-type diffused layer is Vx (−8V≦Vx≦10 V), the detecting circuit is constituted so that the reverse junction withstand voltage BVjX at the junction between the n type diffused layer 15 and the p-well region 11 at each point satisfies BVjX>(Vx−Va).

Further, at the junction I 25 between the n-type diffused layer 15 to which the potential of VH is applied and the p-well 11, the highest reverse junction withstand voltage is required. Therefore, the detecting circuit may be constituted so that the reverse junction withstand voltage BVjX (BVjX>10 V−Va) can be uniformly obtained at all the points of the n-type diffused layer 15.

(Embodiment 2)

In the first embodiment, the resistor comprises an n-type diffused layer formed within the p type substrate 10 in the triple well structure. On the other hand, referring to FIGS. 6A and 6B, an example will be explained in which the resistor comprises a p-type diffused layer formed in the n-well within the p-type substrate 10.

Figure 6A:
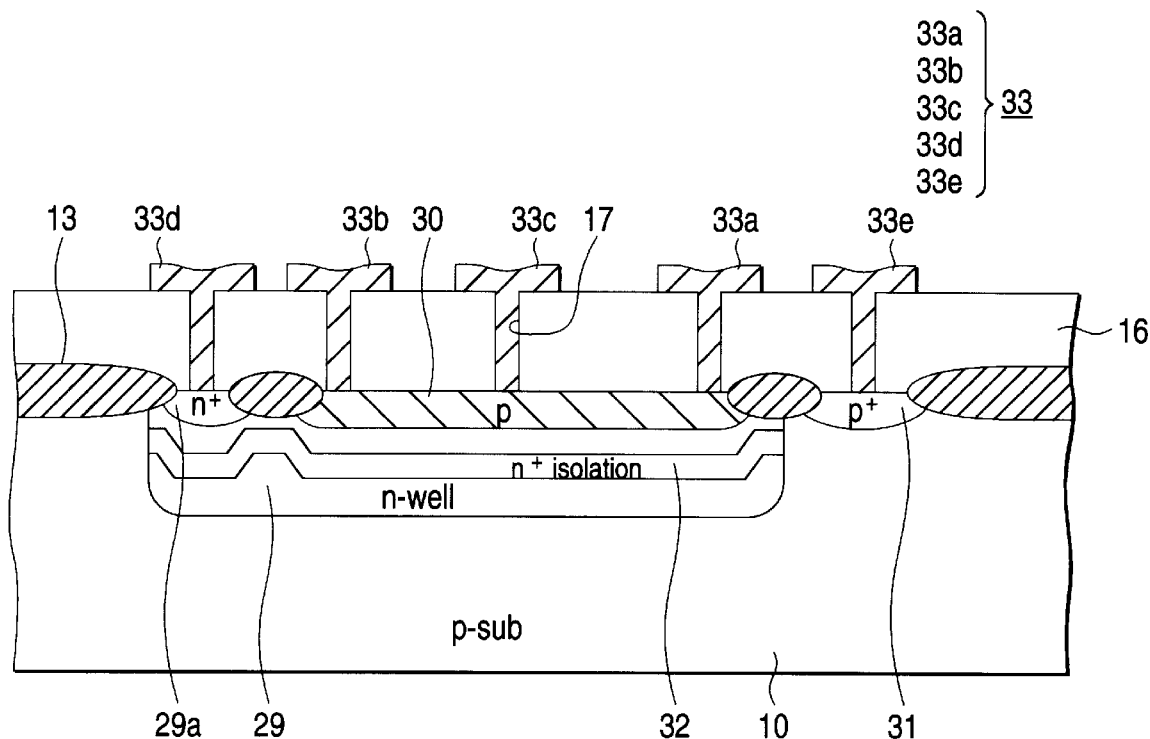
FIGS. 6A and 6B are sectional views showing the structure of a semiconductor device and an applied voltage and reverse junction withstand voltage according to the second embodiment of the present invention.
Figure 6B:
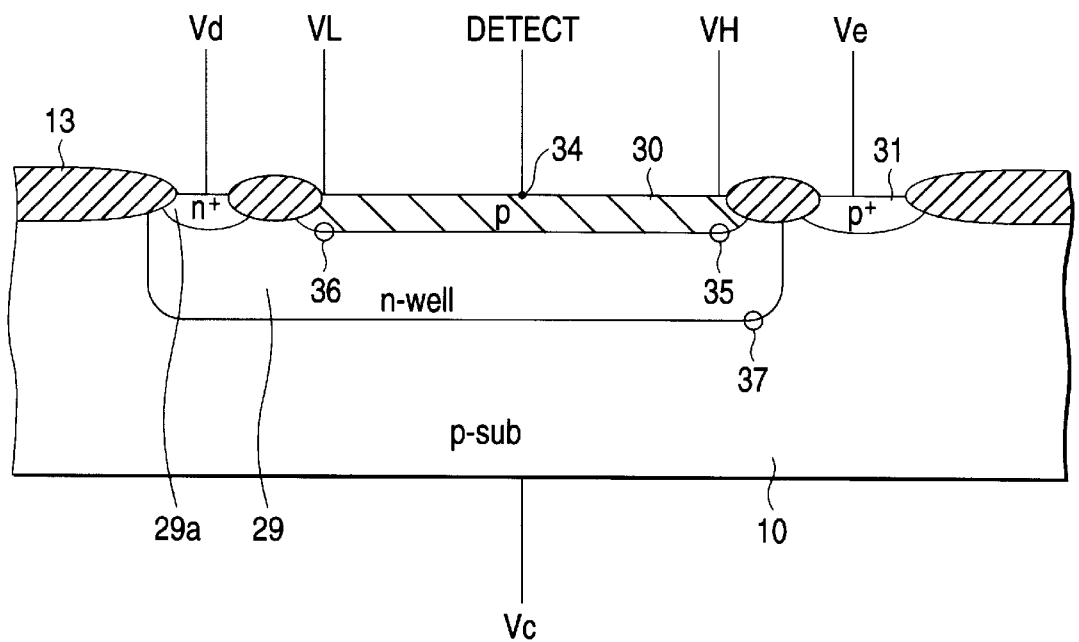

FIG. 6A is a sectional view of the structure of a detecting circuit incorporated in an EEPROM according to the second embodiment of the present invention. FIG. 6B is a sectional view for explaining the voltage to be applied to the detecting circuit and a reverse junction withstand voltage.

In these figures, reference numerals 10, 13, 16 and 17 refer to like parts in FIGS. 1A and 1B. Reference numeral 29 denotes an n-well formed within the p-type substrate 10; 29a an electrode contacting layer of the n-well region 29; 30 a p type diffused layer formed in the n-well region and serving as an impurity diffused layer constituting the resistor of the detecting circuit; 31 an electrode contacting layer of the p-type substrate 10; 32 an isolation layer for improving the element isolation formed within the n-well region 29. Reference numeral 33 denotes a wiring layer with which the connecting hole 17 is filled. Specifically, 33a is a wiring layer for connecting the potential VH generated in the boosting circuit which can supply a plus (+) potential of e.g. 10 V to one terminal of the p type diffused layer 30 which is a resistor; 33b is a wiring layer for connecting the potential VL generated in the boosting circuit which can supply a minus (−) potential of e.g. −8 V to the other terminal of the p type diffused layer 30 which is a resistor; 33c a wiring layer for detecting the potential at a prescribed point (potential detecting point) of the p type diffused layer 30; 33d a wiring layer connected to the electrode contacting layer 29a of the p-well region 29; 33e is a wiring layer connected to the electrode contacting layer 31 of the p type substrate 10.

The boosted voltage VH is connected to one end of the p-type diffused layer 30, and the boosted voltage VL is connected to the other end of the p-type diffused layer 30. Symbol Vd denotes a fixed potential applied to the electrode contacting layer 29a of the n-well region 29. Symbol Ve denotes a fixed potential applied to the electrode contacting layer 31 of the p-type substrate 10. Symbol Vc denotes a fixed potential of the p-type substrate. Reference numeral 34 denotes a potential detecting point of the p-type diffused layer 30.

Reference numeral 35 denotes a junction between the p-type diffused layer 30 to which the potential VH is applied and the n-well region 29 (referred to as "junction (1)a"). Reference numeral 36 denotes a junction between the n-type diffused layer 29 to which the potential VL is applied and the n-well region 29 (referred to as "junction (2)a"). Reference numeral 37 denotes a junction between the n-well region 29 and the p-type substrate 10 (referred to as "junction (5)").

In this embodiment, the p-type diffused layer constituting a resistor of the detecting circuit is formed by ion implantation, for example, simultaneously with another p-type diffused layer (not shown) formed on the p-type substrate 10. For example, the p-type impurity (e.g. boron) diffused layer constituting a source/drain region of a p-type MOS transistor has a high sheet resistance of about 120 Ω/□.

Therefore, as in the first embodiment, the resistor of the detecting circuit, which is formed of the p-type diffused layer 30, can have much higher resistance with a smaller area than that of the resistor formed of the same material as that of the floating gate or control gate in the prior art.

Realization of the resistor (p-type diffused layer 30) having high resistance can reduce the current flowing through the detecting circuit, thereby suppressing power consumption and preventing surplus current leakage from the boosting circuit so that reduction in the boosted potential in the boosting circuit can be prevented. Further, when the interlayer oxide film is etched to form the connecting hole, a problem of over-etching does not occur so that at the contact with the overlying wiring layer 33, stabilized contact resistance can be obtained, thereby detecting the potential of the boosting circuit reliably. Further, the detecting circuit according to this embodiment can surely attain the advantage described above in its application to the DINOR type flash memory. Thus, a DINOR type flash memory with high performance and high reliability can be obtained.

The voltages applied to the detecting circuit in order to prevent the current in the forward and backward directions are defined as follows.

At junction (1)a 35, $-BVJ$ (1)a$<VH-Vd<0.6$ V

At junction (2)a 36, $-BVj$ (2)a$<VL-Vd<0.6$ V

At junction (3) 37, $-BVj$ (5)$<Ve$ (Vc)$-Vd<0.6$ V.

Like the first embodiment, under the condition that BVj (5)=25 V; VH=10 V and VL=−8 V; and Ve=Vc=0 V (the p-type substrate is generally grounded), from the above equations, the following condition is obtained.

$9.4V<Vd<25$ V

BVj (1)a$>Vd-10V$

BVj (2)a$>Vd+8$ V

Figure 7:
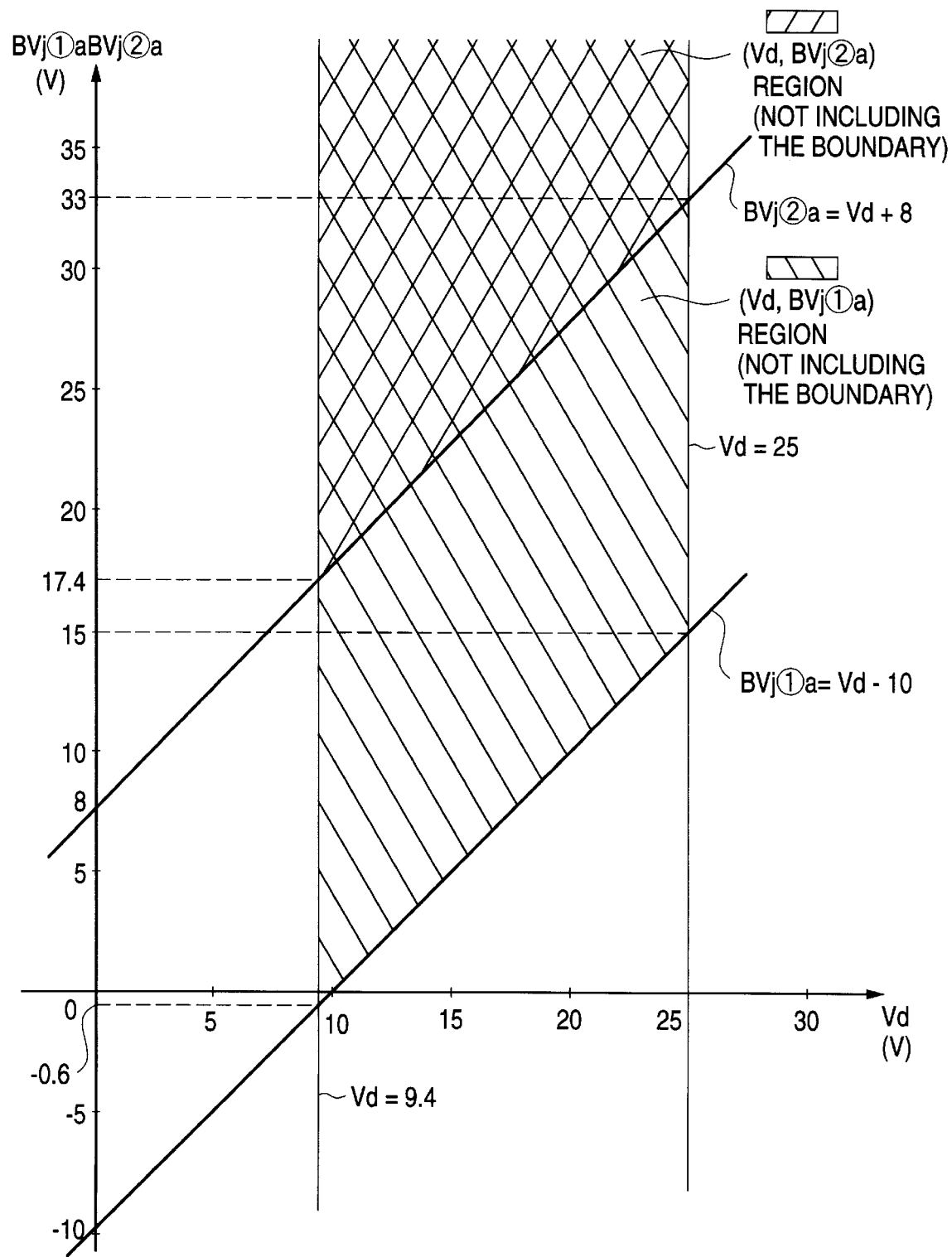
FIG. 7 is a graph of the voltage applied to the detecting circuit according to the second embodiment of the present invention and the reverse junction withstand voltage in the detecting circuit.

Thus, the ranges of Vd, BVj (1)a, and BVj (2)a are represented by the shaded portion in FIG. 7. It can be seen that at the junction (2)a 36 between the p-type diffused layer to which the potential of VL is applied and the n-well region 29, a reverse junction withstand voltage BVj (2)a exceeding 17.4 V is required.

In this case, the detecting circuit may be constructed so that the reverse junction withstand voltage between the p-type diffused layer 30 and the n-well region 29 is required in accordance with the respective points of the p-type diffused layer 30, or otherwise the reverse junction withstand voltage BVjX (BVjX>Vd+8 V) can be uniformly obtained at all the points of the p-type diffused layer 30.

(Embodiment 3)

As regards the structure of the detecting circuit shown in the first embodiment, an explanation will now be given of a modification for improving the reverse junction withstand voltage between the n-type diffused layer 15 and p-well region 11.

The reverse junction withstand voltage can be improved by reducing the impurity concentration of one or both of the n-type diffused layer 15 and the p-well region 11. Particularly, the impurity concentration of the p-well region 11 can be efficiently reduced by reducing that of the p-type isolation layer 14.

As shown in FIGS. 1A and 1B, the highly doped isolation layer 14 for improving the isolation characteristic of element isolation is formed in proximity to and below the field oxide film 13 at the impurity concentration of about $5E17/cm^3$ by ion implantation. In this case, at the lower end of the field oxide film 13, the isolation layer 14 and the n-type diffused layer 15 are made adjacent to each other. As described above, at the junction (1) 25 between the end of the n-type diffused layer 15 to which the potential of VH is applied and the p-well region 11, the highest reverse junction withstand voltage is required (FIG. 3). The reverse junction withstand voltage can be improved by at least 2 to 3 V by reducing the impurity concentration of the isolation layer 14 adjacent to the junction so as to not exceed about $1E17/cm^3$.

In this way, the reverse junction withstand voltage can be efficiently improved by reducing the impurity concentration of the isolation layer 14 formed adjacently to and below the field oxide film 13 to not more than about $1E17/cm^3$.

Incidentally, the isolation layer 14 for improving the isolation characteristic of element isolation formed by ion implantation after the field oxide film 13 has been formed may be formed only below the field oxide film 13. But if the size of the field oxide film 13 is very small, it is difficult to form the isolation layer 14 only at the area corresponding to the field oxide film 13. Therefore, the isolation layer will be formed also at areas other than the field oxide film 13. But, at this area, by ion implantation, impurities are injected without passing through the field oxide film 13 so that the isolation layer 14 is formed at a deeper position, thus giving no adverse effect on the reverse junction withstand voltage between the n-type diffused layer 15 and the p-well region 11.

(Embodiment 4)

Figure 8:
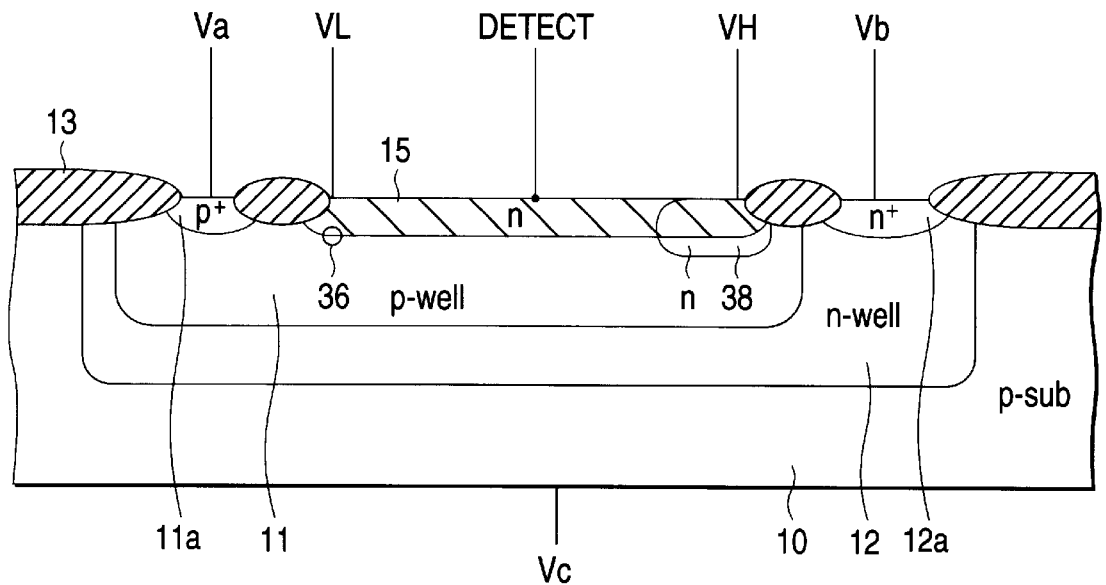
FIG. 8 is a sectional view showing the structure of a semiconductor device according to the fourth embodiment of the present invention.

Now referring to FIG. 8, an explanation will be given of the detecting circuit according to the fourth embodiment. As seen from FIG. 8, a second n-type layer 38 serving as a second impurity diffused layer is formed in a prescribed area extending from the end of the n-type diffused layer 15 to which the potential of VH is applied and in proximity to and below the n-type diffused layer 15. The second n-type layer 38 has a lower impurity concentration than that of the n-type diffused layer 15. Thus, since the impurity concentration of the n-type diffused layers 15 and 38 forming a junction with the p-well region 11 can be reduced at the area which a high potential is applied to and requires a high reverse junction withstand voltage, the reverse junction withstand voltage can be effectively improved.

In this case, the impurity concentration of the second n-type diffused layer 38 is desired to be lower by one or more order of magnitude than that of the n-type diffused layer 15. For example, with the n-type diffused layer 15 at the impurity concentration of about $1E20/cm^3$ and the second n-type diffused layer 38 at the impurity concentration of about $1E18/cm^3$, the n-type diffused layer 15 is formed simultaneously with the highly doped diffused layer of the source/drain region and the second n-type diffused layer 38 is formed simultaneously with the lightly doped diffused layer of the source/drain region, thus easily improving the reverse junction withstand voltage.

(Embodiment 5)

Figure 9:
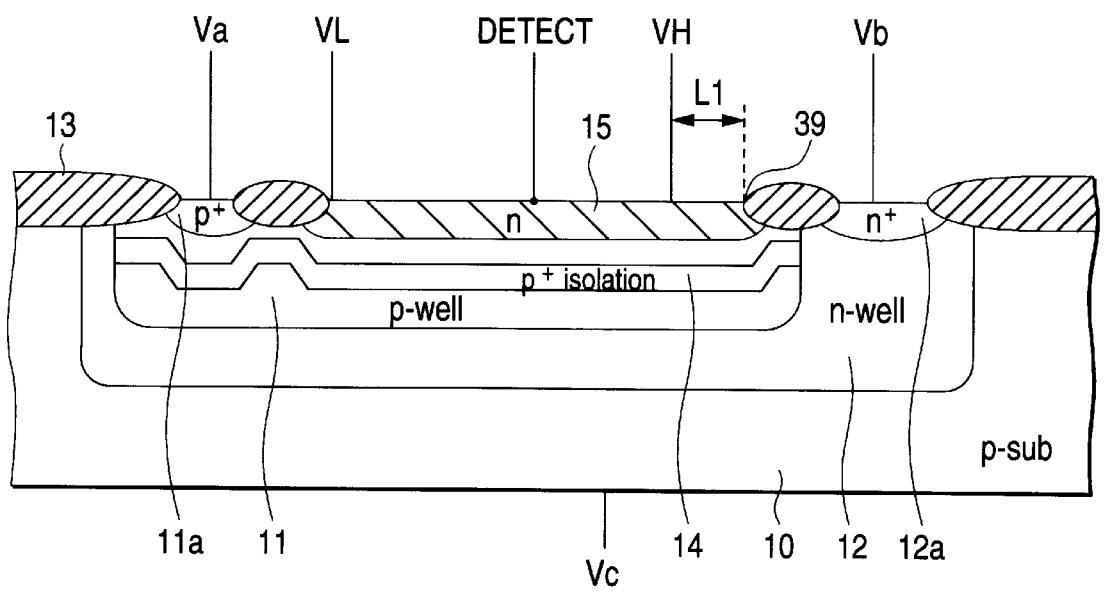
FIG. 9 is a sectional view showing the structure of a semiconductor device according to the fifth embodiment of the present invention.

Referring to FIG. 9, an explanation will now be given of the detecting circuit according to the fifth embodiment of the present invention. As seen from FIG. 9, the position of the n-type diffused layer 15 to which the potential of VH is applied, i.e. where the connecting hole 17 (see FIGS. 1A and 1B) for connecting VH is to be formed is separated from the field oxide film 13 by a prescribed length L1. Thus, the potential at the end 39 of the n-type diffused layer 15 abutting on the field oxide film 13 will be lowered by the resistance of the n-type diffused layer 15.

The end 39 of the n-type diffused layer 15, which is adjacent to the isolation layer 14 formed in proximity to and below the field oxide film 13, has a slightly lower reverse junction voltage with the p-well region 11. But, since the position where the potential of VH is applied and the highest reverse junction withstand voltage is required is separated from the field oxide film 13 by a prescribed distance L1, the margin for the reverse junction withstand voltage is increased. Then, L is desired to be about 1 μm. This suppresses an increase in the area of the n-type diffused layer 15 and surely improves the reverse junction withstand voltage by at least 2–3 V or so. Thus, the performance of the reverse junction withstand voltage of the detecting circuit as a resistor (n-type diffused layer 15) for the p-well 11 can be improved.

(Embodiment 6)

Figure 10:
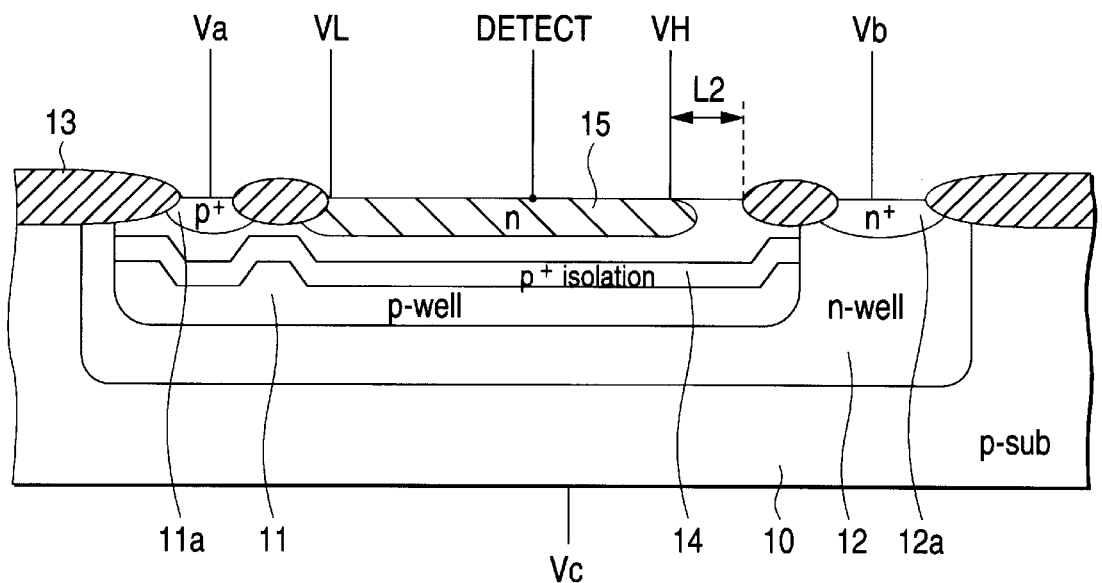
FIG. 10 is a sectional view showing the structure of a semiconductor device according to the sixth embodiment of the present invention.

In the sixth embodiment, the position where the connecting hole 17 for connection the potential of VH is to be formed is separated from the field oxide film 13 by a prescribed distance. But, as shown in FIG. 10, the n-type diffused layer 15 may be formed so that the end where the potential of VH is applied is separated from the field oxide film 13 by a prescribed distance L2. In this case also, since the position where the potential of VH is applied and the highest reverse junction withstand voltage is required is separated from the field oxide film 13 by the prescribed distance L2 to prevent its proximity to the isolation layer, the performance of the reverse junction withstand voltage of the detecting circuit as a resistor (n-type diffused layer 15) for the p-well 11 can be improved. Like the fifth embodiment, in this embodiment, L2 is desired to be about 1 μm. This suppresses an increase in the area of the n-type diffused layer 15 and surely improves the reverse junction withstand voltage by at least 2–3 V or so.

(Embodiment 7)

Figure 11:
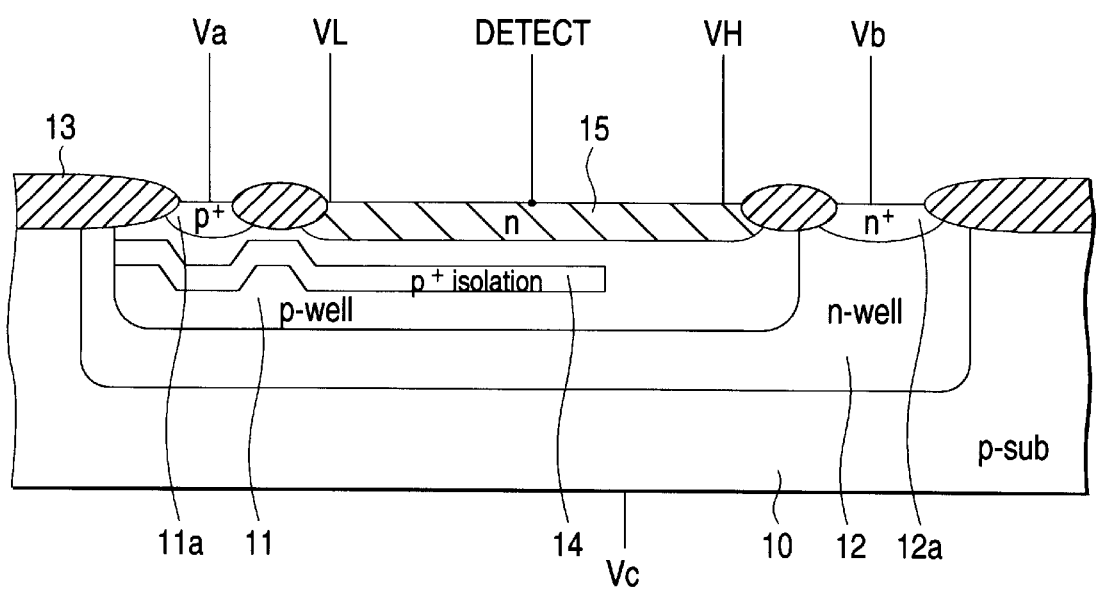
FIG. 11 is a sectional view showing the structure of a semiconductor device according to the seventh embodiment of the present invention.

Referring to FIG. 11, the detecting circuit according to the seventh embodiment will now be explained. As seen from FIG. 11, in order to prevent proximity of the terminal of the n-type diffused layer to the isolation layer 14, the isolation layer 14 may be omitted at the area below and in the vicinity of the field oxide film 13 abutting on the end of the n-type diffused layer 15. Thus, at the area where the high potential is applied and hence the high reverse junction voltage is applied, the impurity concentration of the p-well region 11 forming a PN junction with the n-type diffused layer 15 can be reduced so that the reverse junction withstand voltage can be improved.

(Embodiment 8)

Figure 12:
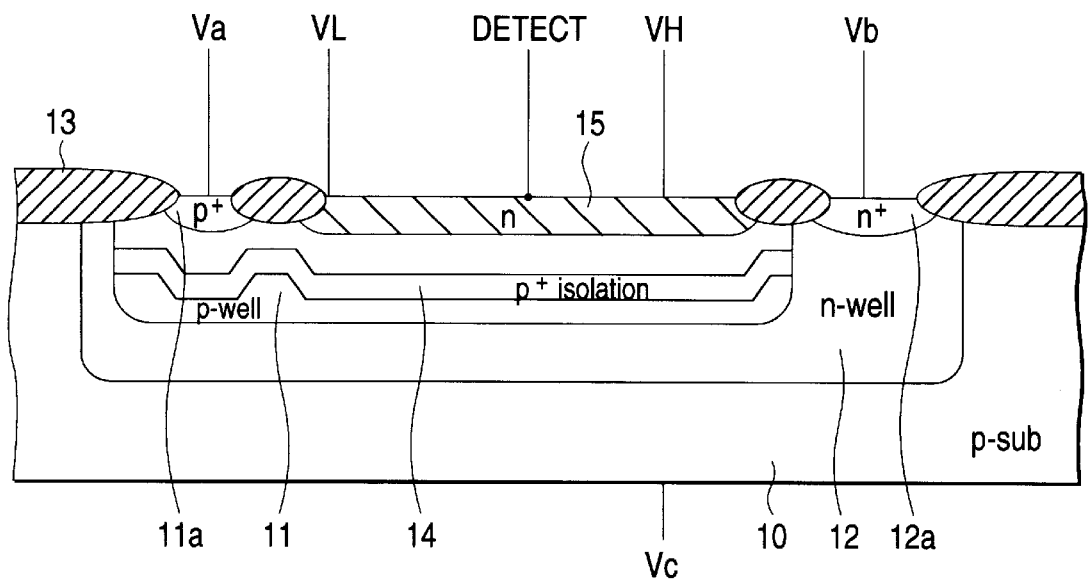
FIG. 12 is a sectional view showing the structure of a semiconductor device according to the eighth embodiment of the present invention.

Further, in order to prevent proximity between the end of the n-type diffused layer 15 to which the potential of VH is applied and the isolation layer 14, as shown in FIG. 12, the isolation layer 14 may be formed at a deeper position.

The isolation layer 14 is generally formed by ion implantation through the field oxide film 13 with such energy that the peak concentration of implanted impurity ions (boron) is located at a depth of about 10% of the thickness of the field oxide film 13. In this embodiment, the isolation layer is formed by ion implantation through the field oxide film 13 with such energy that the peak concentration of implanted impurity ions (boron) is located at a depth of about 15–20% of the thickness of the field oxide film 13. This satisfies the required element isolation separation characteristic as well as for the reverse junction between the n-type diffused layer 15 and p-well region 11 by at least 2–3 V.

In this way, by forming the isolation layer 14 so that the peak concentration of implanted impurity ions (boron) is located at a deep position of about 15–20% of the thickness of the field oxide film 13, the reverse junction withstand voltage can be improved efficiently.

(Embodiment 9)

Figure 13:
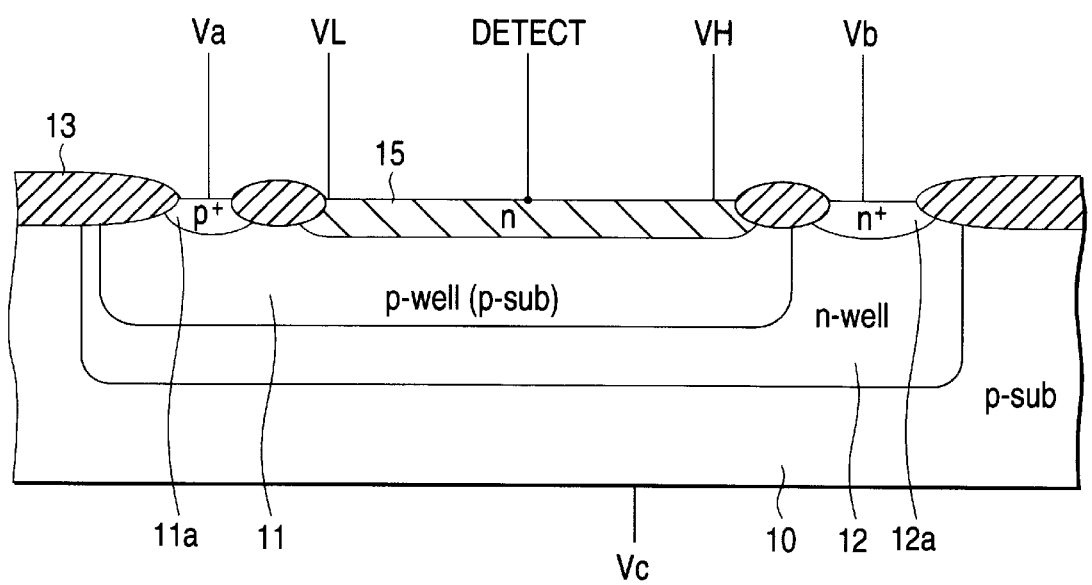
FIG. 13 is a sectional view showing the structure of a semiconductor device according to the ninth embodiment of the present invention.

The isolation layer 14 may not be formed over the entire area where the n-type diffused layer 15 is formed. Otherwise, as shown in FIG. 13, the p-well region 11 can be formed not by implantation of p-type impurities but by dividing the p-type well region 11 with an intervening n-well region 12 therebetween. Thus, the impurity concentration of the p-well region 11 can be reduced to improve the reverse junction withstand voltage for the n-type diffused layer 15.

In the third to ninth embodiments, examples of applications to the first embodiment have been proposed. But, the n-type dopant impurities can be replaced by p-type impurities. These examples may be applied to the second embodiment to provide the same advantage. But, where the impurity diffused layers 15 and 30 constituting the resistor are of the p-type, the highest reverse junction withstand is required at the position to which the boosted potential VL is connected. For this reason, in the fourth to the seventh embodiments, if the impurity diffused layers 15 and 30 are of the p-type, the positions to which VH and VL are connected should be respectively replaced by that to which VL and VH are connected.

(Embodiment 10)

Figure 14:
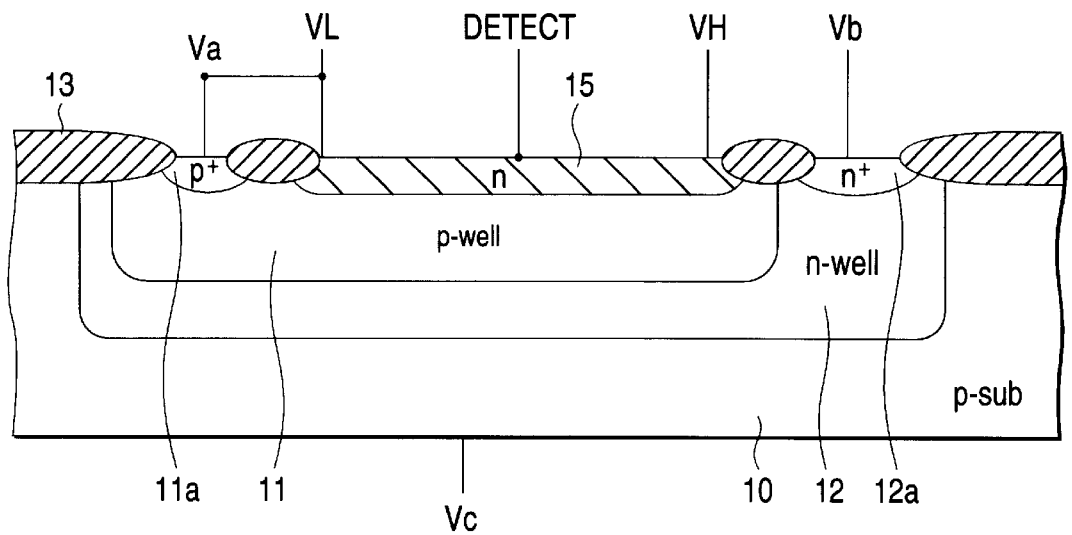
FIG. 14 is a sectional view showing the structure of a semiconductor device according to the tenth embodiment of the present invention.
Figure 15:
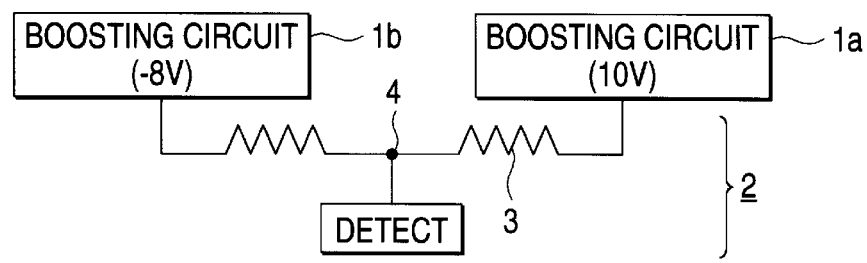
FIG. 15 is a circuit diagram showing the circuit configuration for boosting and detection in a conventional semiconductor device.
Figure 16:
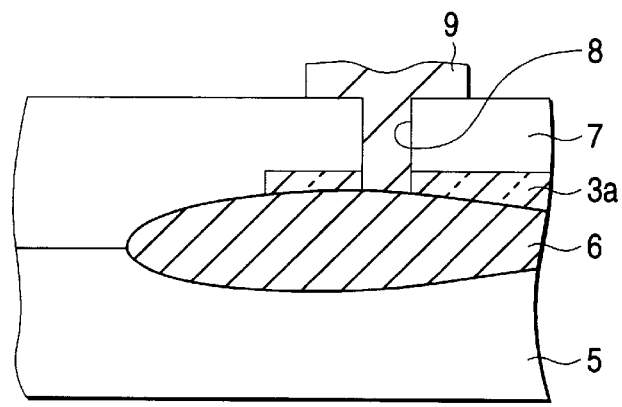
FIG. 16 is a sectional view for explaining the problem of the conventional semiconductor device.

Referring to FIG. 14, an explanation will now be given of the detecting circuit according to this embodiment. In this embodiment, the wiring layer 18d through which the fixed potential Va of the p-well region 11 is connected to the electrode extracting layer 18d is short-circuited with the wiring layer 18b through which VL is connected to the n-type diffused layer 15 (see FIGS. 1A and 1B) so that Va and VL are placed at the same potential.

Thus, the wiring and circuit for the fixed potential Va of the p-well region 11 can be simplified, thus making it easy to fabricate the semiconductor device.

In this embodiment also, the n-type and p-type impurity dopings may be replaced by each other. In addition, this embodiment can be applied to the structure proposed in the second embodiment where Va and VH (or VL) are at the same potential. In this case also, the wiring and circuit for the fixed potential Va (or Vd) of the well region abutting on the resistor (impurity diffused layer) can be reduced, thus making it easy to fabricate the detecting circuit.

As described above, in accordance with the present invention, since the resistor of the detecting circuit is formed of the impurity diffused layer, very high resistance can be realized with a small area. The current flowing through the detecting circuit can be reduced so that power consumption is reduced. The leakage of surplus current from the boosting circuit can be prevented so that reduction of the boosted potential in the boosting circuit is prevented. Thus, the potential in the boosting circuit can be detected reliably and stably. Accordingly, there can be provided a semiconductor device which can promote miniaturization and high integration and includes the boosting circuit and detecting circuit with improved reliability.

In accordance with the present invention, in the semiconductor substrate having a first conductivity type are formed a well region having a first conductivity type and another well region having a second conductivity type and surrounding the lower surface and side of the first-conductivity-type well region, and the impurity diffused layer constituting the resistor is formed to have the first conductivity type within the well region having the first conductivity type.

For this reason, there can be provided easily and reliably a semiconductor device which can promote miniaturization and high integration and includes the boosting circuit and detecting circuit with improved reliability.

In accordance with the present invention, the well region having the second conductivity type is formed in the semiconductor substrate having the first conductivity type and the impurity diffused layer constituting the resistor is formed to have the first conductivity type within the well region having the second conductivity type. For this reason, there can be provided easily and reliably a semiconductor device which can promote miniaturization and high integration and includes the boosting circuit and detecting circuit with improved reliability.

In accordance with the present invention, the boosting circuit and detecting circuit are incorporated in an EEPROM (Electrically Erasable and Programmable ROM). For this reason, there can provided the EEPROM which can promote miniaturization and high integration and includes the boosting circuit and detecting circuit with improved reliability.

In accordance with the present invention, the boosting circuit and detecting circuit are incorporated into a DINOR (Divided bit-line NOR) type flash memory. For this reason, the DINOR type flash memory can realize both low-voltage, low power and high speed rewrite and is suitable to high integration which can further improve its performance and reliability.

In accordance with the present invention, in the semiconductor device of aspect 2, the fixed voltages of the well regions and the semiconductor substrate are set so that at the respective junctions between the impurity diffused layer and the well region, between the well regions and between the well region and the semiconductor substrate, the potential difference between the regions forming the junction are equal to or lower than the forward and reverse junction withstand voltage. For this reason, there can be provided easily and reliably a semiconductor device which can promote miniaturization and high integration and includes a boosting circuit and detecting circuit with improved reliability.

In accordance with the present invention, in the semiconductor device of aspect 3, the fixed voltages of the well region and the semiconductor substrate are set so that at the respective junctions between the impurity diffused layer and the well region having the second conductivity type, and between the well region and the semiconductor substrate, the potential difference between the regions forming the junction are equal to or lower than the forward and reverse junction withstand voltages. For this reason, there can be provided easily and reliably semiconductor device which can promote miniaturization and high integration and includes a boosting circuit and detecting circuit with improved reliability.

In accordance with the present invention, at the junction between the impurity diffused layer and the well region, the reverse junction withstand voltage at respective points of the impurity diffused layer for the well region is set so as to be larger than the potential difference between the different potentials applied to the respective points of the impurity diffused layer when the boosted potentials VH and VL are applied to the impurity diffused layer and the fixed potential Va (or Vd) of the well region. For this reason, there can be provided easily and reliably a semiconductor device which can promote miniaturization and high integration and includes a boosting circuit and detecting circuit with improved reliability.

In accordance with the present invention, since the isolation layer below the field oxide film is formed to have a low impurity concentration not exceeding about $1E17/cm^3$, the reverse junction withstand voltage between the impurity diffused layer and well region can be effectively improved, thereby improving reliability of the detecting circuit.

In accordance with the present invention, the isolation layer is formed so that the peak concentration of implanted impurity ions is located at a deep position of about 15–20% of the thickness of the field oxide film from its bottom. Thus, the reverse junction, withstand voltage between the impurity diffused layer and well region can be effectively improved, thereby improving reliability of the detecting circuit.

In accordance with the present invention, the impurity diffused layer is formed of the n-type (or p-type) and the isolation layer is not formed at the area below and in the vicinity of the field oxide film abutting on the end of the impurity diffused layer on the side to which the boosted potential VH (or VL) is connected. Thus, the reverse junction withstand voltage between the impurity diffused layer and well region can be effectively improved, thereby improving reliability of the detecting circuit.

In accordance with the present invention, since the isolation layer is not formed over the entire area where the impurity diffused layer is formed, the reverse junction withstand voltage between the impurity diffused layer and well region can be effectively improved, thereby improving reliability of the detecting circuit.

In accordance with the present invention, since the impurity diffused layer is formed of the n-type (or p-type), and in a prescribed region extending from the end of the impurity diffused layer to which the boosted potential of VH (or VL) is connected, a second impurity diffused layer having the same conductivity type as and a lower impurity concentration than those of the impurity diffused layer is formed in proximity to and below the impurity diffused layer. Thus, the reverse junction withstand voltage between the impurity diffused layer and well region can be effectively improved, thereby improving reliability of the detecting circuit.

In accordance with the present invention, the impurity diffused layer is formed of the n-type (or p-type), and the position in the impurity diffused layer to which the boosted potential VH (or VL) is connected is separated from the field oxide film separating the impurity diffused layer from other regions by a prescribed distance from the field oxide film. Thus, the reverse junction withstand voltage of the resistor in the detecting circuit for the well region can be effectively improved, thereby improving reliability of the detecting circuit.

In accordance with the present invention, since the position in the impurity diffused layer to which the boosted potential VH (or VL) is connected is separated from the field oxide film by about 1 $\mu$m, the reverse junction withstand voltage performance of the resistor for the well region in the detecting circuit for the well region can be improved effectively and surely, thereby further improving reliability of the detecting circuit.

In accordance with the present invention, the impurity diffused layer is formed of the n-type (or p-type), and the end of the impurity diffused layer on the side of which the boosted potential V-H (or VL) is connected is separated from the field oxide film separating the impurity diffused layer from other regions by a prescribed distance from the field oxide film. Thus, the reverse junction withstand voltage performance of the resistor for the well region in the detecting circuit for the well region can be improved effectively and surely, thereby further improving reliability of the detecting circuit.

In accordance with the present invention, since the end of the impurity diffused layer is separated from the field oxide film separating the impurity diffused layer from other regions by about 1 $\mu$m from the field oxide film, the reverse junction withstand voltage performance of the resistor for the well region in the detecting circuit for the well region can be improved effectively and surely, thereby further improving reliability of the detecting circuit.

In accordance with the present invention, the impurity diffused layer is formed of the n-type and the fixed potential Va (or Vd) of the well region abutting on the impurity diffused layer is set at a potential equal to the boosted potential VL, or otherwise the impurity diffused layer is formed of the p-type and the fixed potential Va (or Vd) of the well region abutting on the impurity diffused layer is set at a potential equal to the boosted potential VH. Thus, the wiring and circuit for the fixed potential Va (or Vd) of the well region abutting on the resistor (impurity diffused layer) can be simplified, thus making it easy to fabricate the detecting circuit.

In accordance with the present invention, the impurity diffused layer constituting the resistor is formed simultaneously with a highly doped diffused layer constituting a source/drain region of an MOS transistor formed on the semiconductor substrate or with a lightly doped diffused layer constituting an LDD structure. For this reason, there can be provided easily and reliably a semiconductor device which can promote miniaturization and high integration and includes a boosting circuit and detecting circuit with improved reliability.

In accordance with the present invention, the semiconductor substrate having the first conductivity type is divided by forming a well region of the second conductivity type, and the impurity diffused layer constituting a resistor is formed in a prescribed area of the semiconductor substrate surrounded by the well region. Thus, the reverse junction withstand voltage between the impurity diffused layer and well region can be effectively improved, thereby easily fabricating a semiconductor device having a detecting circuit with improved reliability.

What is claimed is:

1. A semiconductor device including a circuit configuration formed on a semiconductor substrate, comprising:
    a boosting circuit for boosting an external power supply voltage to a plus voltage VH and a minus voltage VL; and
    a detecting circuit having a resistor formed of an impurity diffused layer so that the plus voltage VH and the minus voltage VL boosted by said boosting circuit are respectfully connected to said resistor to detect a potential at a prescribed point of said resistor so as to verify whether or not said boosting circuit has generated a desired potential, wherein:
    the semiconductor substrate is of a first conductivity type, further comprising:
    a well region having the first conductivity type formed in said substrate, said well region having a lower surface and a side, and another well region having a second conductivity type formed in said substrate and surrounding said lower surface and said side of the first-conductivity-type well region, and
    said impurity diffused layer constituting said resistor is formed to have the second conductivity type within said well region having the first conductivity type, wherein:
    the plus boosted potential VH supplied by said boosting circuit is connected to one end of the impurity diffused layer of said resistor, and the minus boosted potential VL is connected to the other end of the impurity diffused layer of said resistor; and
    said device is characterized that when said detecting circuit operates,
        a fixed potential Va is applied to said well region having the first conductivity type, a fixed potential Vb is applied to said well region having the second conductivity type, and a fixed potential Vc is applied to said semiconductor substrate, and
    said fixed potentials Va, Vb, and Vc are set so that at the respective junctions between said impurity diffused layer of said resistor and said well region having the first conductivity type, between said well regions having the first and second conductivity types, and between said well region having the second conductivity type and said semiconductor substrate, the potential difference between each of said regions forming a respective junction is equal to or lower than the forward and reverse junction withstand voltages.

2. A semiconductor device including a circuit configuration formed on a semiconductor substrate, comprising:
    a boosting circuit for boosting an external power supply voltage to a plus voltage VH and a minus voltage VL; and
    a detecting circuit having a resistor formed of an impurity diffused layer so that the plus voltage VH and the minus voltage VL boosted by said boosting circuit are respectively connected to said resistor to detect a potential at a prescribed point of said resistor so as to verify whether or not said boosting circuit has generated a desired potential, wherein:
    the semiconductor substrate of a first conductivity type, further comprising:
    a well region having a second conductivity type formed in said semiconductor substrate having the first conductivity type, and
    said impurity diffused layer constituting said resistor is formed to have the first conductivity type within said well region having the second conductivity type, wherein the plus boosted potential VH supplied by said boosting circuit is connected to one end of the impurity diffused layer of said resistor, and the minus boosted potential VL is connected to the other end of the impurity diffused layer of said resistor; and
    said device is characterized that when said detecting circuit operates,
        a fixed potential Vd is applied to said well region having the second conductivity type, a fixed potential Ve is applied to said semiconductor substrate, and the fixed potentials Vd and Ve are set so that at the respective junctions between said impurity diffused layer of said resistor and said well region having the second conductivity type, and between said well region having the second conductivity type and said semiconductor substrate, and the potential difference between each of said regions forming a respective junction is equal to or lower than the forward and reverse junction withstand voltages.

3. The semiconductor device of claim 1, wherein at said junction between said impurity diffused layer of said resistor and said well region of first conductivity type, when the boosted potentials VH and VL are applied to said impurity diffused layer of said resistor, the reverse junction withstand voltage at respective points along the junction of said impurity diffused layer of said resistor with said well region of first conductivity type is set so as to be larger than the potential difference between the respective points of said impurity diffused layer of said resistor and the fixed potential Va of said well region of first conductivity type.

4. The semiconductor device of claim 63, comprising:

a field oxide film for element isolation, and an isolation layer formed in proximity to and below said field oxide film and formed by ion implantation, wherein when said impurity diffused layer of said resistor is formed as n-type, said isolation layer is not formed at the area below and in the vicinity of said field oxide film abutting on the end of said impurity diffused layer of said resistor on the side to which the boosted potential VH is supplied, and when said impurity diffused layer of said resistor is formed p-type, said isolation layer is not formed at the area below and in the vicinity of said field oxide film abutting on the end of said impurity diffused layer of said resistor on the side to which the boosted potential VL is supplied.

5. The semiconductor device of claim 3, comprising:

a field oxide film for element isolation, and an isolation layer formed in proximity to and below said field oxide film and formed by ion implantation, wherein said isolation layer is not formed over the entire area where said impurity diffused layer of said resistor is formed.

6. The semiconductor device of claim 3, wherein when said impurity diffused layer of said resistor is formed as n-type, in a prescribed region extending from the end of said impurity diffused layer of said resistor to which the boosted potential VH is supplied, and when said impurity diffused layer of said resistor is formed as p-type, in a prescribed region extending from the end of said impurity diffused layer of said resistor to which the boosted potential VL is supplied, a second impurity diffused layer having the same conductivity type as and a lower impurity concentration than that of said impurity diffused layer is formed in proximity to and below said impurity diffused layer of said resistor.

7. The semiconductor device of claim 3, comprising:

a field oxide film for element isolation, and an isolation layer formed in proximity to and below said field oxide film and formed by ion implantation, wherein when said impurity diffused layer of said resistor is formed as n-type, the position on said impurity diffused layer at which the boosted potential VH is supplied is spaced apart from said field oxide film separating said impurity diffused layer of said resistor from other regions by a prescribed distance from said field oxide film, and when said impurity diffused layer of said resistor is formed as p-type, the position on said impurity diffused layer of said resistor at which the boosted potential VL is supplied is spaced apart from said field oxide film separating said impurity diffused layer of said resistor from other regions by a prescribed distance from said field oxide film.

8. The semiconductor device of claim 1, wherein when said impurity diffused layer of said resistor is formed as n-type, the fixed potential Va of said well region of p-type abutting on said impurity diffused layer of said resistor is set at a potential equal to the boosted potential VL, and when said impurity diffused layer of said resistor is formed as p-type, the fixed potential Va of said well region of n-type abutting on said impurity diffused layer of said resistor is set at a potential equal to the boosted potential VH.

9. The semiconductor device of claim 2, wherein at the junction between said impurity diffused layer of said resistor and said well region of second conductivity type, when the boosted potentials VH and VL are supplied to said impurity diffused layer of said resistor, the reverse junction withstand voltage at respective points along the junction of said impurity diffused layer of said resistor with said well region of second conductivity type is set so as to be larger than the potential difference between the respective points of said impurity diffused layer of said resistor and the fixed potential Vd of said well region of second conductivity type.

10. The semiconductor device of claim 9, comprising:

a field oxide film for element isolation, and an isolation layer formed in proximity to and below said field oxide film and formed by ion implantation, wherein when said impurity diffused layer of said resistor is formed as n-type, said isolation layer is not formed at the area below and in the vicinity of said field oxide film abutting on the end of said impurity diffused layer of said resistor on the side to which the boosted potential VH is supplied, and when said impurity diffused layer of said resistor is formed as p-type, said isolation layer is not formed at the area below and in the vicinity of said field oxide film abutting on the end of said impurity diffused layer of said resistor on the side to which the boosted potential VL is supplied.

11. The semiconductor device of claim 9, comprising:

a field oxide film for element isolation, and an isolation layer formed in proximity to and below said field oxide film and formed by ion implantation, wherein said isolation layer is not formed over the entire area where the impurity diffused layer of said resistor is formed.

12. The semiconductor device of claim 9, wherein when said impurity diffused layer of said resistor is formed as n-type, in a prescribed region extending from the end of said impurity diffused layer of said resistor to which the boosted potential VH is supplied, and when said impurity diffused layer of said resistor is formed as p-type, in a prescribed region extending from the end of said impurity diffused layer of said resistor to which the boosted potential VL is supplied, a second impurity diffused layer having the same conductivity type as and a lower impurity concentration than that of said impurity diffused layer of said resistor is formed in proximity to and below said impurity diffused layer of said resistor.

13. The semiconductor device of claim 9, comprising:

a field oxide film for element isolation, and an isolation layer formed in proximity to and below said field oxide film and formed by ion implantation, wherein when said impurity diffused layer of said resistor is formed as n-type, the position on said impurity diffused layer of said resistor at which the boosted potential VH is supplied is spaced from said field oxide film separating said impurity diffused layer of said resistor from other regions by a prescribed distance from said field oxide film, and when said impurity diffused layer of said resistor is formed as p-type, the position on said impurity diffused layer of said resistor at which the boosted potential VL is supplied is spaced apart from said field oxide film separating said impurity diffused layer of said resistor from other regions by a prescribed distance from said field oxide film.

14. The semiconductor device of claim 2, wherein when said impurity diffused layer of said resistor is formed as n-type, the fixed potential Vd of said well region of p-type abutting on said impurity diffused layer of said resistor is set at a potential equal to the boosted potential VL, and when said impurity diffused layer of said resistor is formed as p-type, the fixed potential Vd of said well region of n-type abutting on said impurity diffused layer of said resistor is set at a potential equal to the boosted potential VH.

* * * * *

UNITED STATES PATENT AND TRADEMARK OFFICE
CERTIFICATE OF CORRECTION

PATENT NO. : 6,069,391
DATED : May 30, 2000
INVENTOR(S) : Kojiro Yuzuriha

It is certified that error appears in the above-identified patent and that said Letters Patent is hereby corrected as shown below:

<u>Column 19, claim 4,</u>
Line 1, change "63" to -- 3 --.

Signed and Sealed this

Eighteenth Day of September, 2001

*Attest:*

*Attesting Officer*

NICHOLAS P. GODICI
*Acting Director of the United States Patent and Trademark Office*